United States Patent [19]

Ashtiani

[11] Patent Number: 5,669,975
[45] Date of Patent: Sep. 23, 1997

[54] PLASMA PRODUCING METHOD AND APPARATUS INCLUDING AN INDUCTIVELY-COUPLED PLASMA SOURCE

[75] Inventor: Kaihan Abidi Ashtiani, Nanuet, N.Y.

[73] Assignees: Sony Corporation, Tokyo, Japan; Materials Research Corp., Orangeburg, N.Y.

[21] Appl. No.: 624,010

[22] Filed: Mar. 27, 1996

[51] Int. Cl.⁶ .................................. C23C 16/00
[52] U.S. Cl. ........................ 118/723 I; 118/723 IR
[58] Field of Search ................ 118/723 I, 723 IR, 118/723 E, 723 ER, 723 MP; 156/345; 204/298.08, 298.34

[56] References Cited

U.S. PATENT DOCUMENTS

| | | | |
|---|---|---|---|
| 4,422,896 | 12/1983 | Class et al. | 156/643 |
| 4,948,458 | 8/1990 | Ogle | 156/643 |
| 4,990,229 | 2/1991 | Campbell et al. | 204/298.06 |
| 5,091,049 | 2/1992 | Campbell et al. | 156/643 |
| 5,226,967 | 7/1993 | Chen et al. | 118/723 |
| 5,280,219 | 1/1994 | Ghanbari | 315/111.41 |
| 5,304,279 | 4/1994 | Coultas et al. | 156/345 |
| 5,401,350 | 3/1995 | Patrick et al. | 156/334 |
| 5,513,765 | 5/1996 | Usui | 216/68 |
| 5,529,657 | 6/1996 | Ishii | 156/345 |
| 5,540,824 | 7/1996 | Yin et al. | 204/298.34 |
| 5,558,722 | 9/1996 | Okumura et al. | 118/723 I |

Primary Examiner—John Niebling
Assistant Examiner—Joni Y. Chang
Attorney, Agent, or Firm—Lise A. Rode, Esq.; Jerry A. Miller

[57] ABSTRACT

An apparatus for processing at least a surface of an article with a uniform plasma includes a processing chamber in which the article is disposed and a plasma source. The plasma source includes a dielectric plate having a first surface forming part of an inner wall of the processing chamber, and an electrical energy source, including a radiofrequency source and a substantially planar induction coil, the latter of which is disposed on a second surface of the dielectric plate, and to which energy from the radiofrequency source is preferably supplied through impedance matching circuitry. The substantially planar induction coil has at least two spiral portions which are symmetrical about at least one point of the substantially planar induction coil, and preferably forming a continuous "S-shape". The shape of the induction coil minimizes the capacitive coupling between the induction coil and the plasma, and thus the plasma sheath voltage drop, thereby improving device damage processing and plasma uniformity at the surface of the article. An impedance matching circuit connected between the substantially planar induction coil and the radiofrequency source minimizes a net voltage drop which often occurs across the leads of a prior art induction coil and thus further improves plasma uniformity at the surface of the article.

41 Claims, 4 Drawing Sheets

PLASMA PRODUCING METHOD AND APPARATUS INCLUDING AN INDUCTIVELY-COUPLED PLASMA SOURCE

BACKGROUND OF INVENTION

1. Field of the Invention

The present invention relates to materials processing such as microelectronics fabrication. More specifically, this invention relates to a method and apparatus including a unique induction coil for processing an article with a high-density plasma.

2. General Background

The use of gaseous plasma in semiconductor fabrication processes is well known. In general, a wafer which is to be processed is disposed in a chamber, having two opposed electrodes which are oriented parallel to the wafer. The chamber is then evacuated to a predetermined vacuum level, and a low pressure feedgas, such as argon, is introduced into the chamber. Once the feedgas is introduced into the chamber, an electric field, typically in the radiofrequency (RF) range, is applied between the two electrodes. This radiofrequency field induces an electron flow between the electrodes, energetic electrons emitted from the cathode colliding with the atoms or molecules of neutral gas to cause the ionization of same to form a gaseous plasma (or glow discharge) adjacent the cathode. The ions of this gaseous plasma are then used to process the wafer via etching, deposition, or similar such procedures.

High-density plasma sources have found increasing application in materials processing, and particularly in microelectronics fabrication processes such as ion implantation, etching, and deposition. Among these sources are electron-cyclotron-resonance (ECR), helicon-wave, and inductively-coupled (ICP) or transformer-coupled (TCP) plasma sources. These sources are capable of producing high-density plasmas at low pressures (often less than $2 \times 10^{-2}$ Torr) for a fast rate processing which is desirable in the manufacturing of current very large scale integrated circuits (VLSI) having diameters up to 200 mm, and future ultra large scale integrated (ULSI) circuits having diameters on the order of 300 mm.

In most materials processing applications, and especially in the etching and deposition of semiconductor substrates or wafers into integrated circuits, plasma uniformity over the surface area of the substrate to be processed is crucial to ensuring that, for example, the etch or deposition process over the wafer area is uniform. Ensuring uniformity of the plasma process over the wafer area is, in turn, important in the control of the critical dimensions of fine line geometry on the wafer.

Recently, ICP (and TCP) plasma sources have been introduced which are capable of producing relatively uniform plasmas. Certain of such ICP (and TCP) plasma sources are based on a spiral antenna, or induction coil, geometry, such as seen in FIG. 1. In prior art ICP coil circuits, a grounded RF power supply 10, ordinarily supplying power at an operating frequency of 13.56 MHZ, is applied to the lead 12 of induction coil 20 through impedance matching circuitry 14, with lead 16 being connected to ground (FIG. 2). The induction coil 20 creates a time-varying magnetic field around the itself at the frequency of the applied RF energy. This time-varying magnetic field in turn induces an electric field in the plasma chamber (not shown), according to one of the well-known Maxwell's equations, $\nabla \times E = -\partial B/\partial t$. Thus, a current will also be induced in a circuit when the circuit is subjected to the time-varying magnetic field, and, in the case of the induction coil 20 of FIG. 1, the resulting current will flow in the direction shown in FIG. 2 at a particular instant of time. (As will be appreciated by those skilled in the art, in accordance with accepted convention, the encircled "X's" ($\otimes$) indicate that the current is flowing into the page, while encircled "points" ($\odot$) indicate that the current is flowing out of the page. Thus, with respect to FIG. 1, the resulting current through the ICP induction coil follows the path BCD).

However, it will also be appreciated that due to the manner in which the RF power supply 10 is connected to the coil 20, a net voltage drop may develop between lead 12 to lead 16 across the plane of coil 20. Such net voltage drop occurs as a result of the asymmetric feed of current through coil 20. More specifically, as current is fed through the coil 20 from one lead to the other, some power is lost to the surrounding plasma due to the inductive coupling between the plasma and the coil 20. This difference in power between lead 12 and lead 16 results in a corresponding difference in voltage between such lead in the direction shown in FIG. 2. Such a voltage may cause unwanted degradation in the plasma uniformity and therefore in the plasma process.

Another problem which results from the prior art coil of FIGS. 1 and 2 is that capacitive coupling which occurs between the plasma and coil. This capacitive coupling in turn results in an undesirable increase in the plasma sheath voltage [i.e., the voltage drop across the plasma sheath, which is that area between the cathode surface and the glow discharge (or plasma) adjacent the cathode]. An increase in the plasma sheath voltage will in turn increase the amount of energy with which the ions impinge upon the substrate, which often results in an increase in damaged devices during processing. A Faraday shield is often employed in apparatuses using the prior art coil in order to minimize the effects of the capacitive coupling. Such shield is generally disposed directly under the coil 20 to short out some of the electric field and thus voltage in certain directions in the apparatus and thus minimize such capacitive coupling. However, as a Faraday shield adds cost and complexity to the overall processing apparatus, it is undesirable from an economic and overall manufacturing perspective.

Thus it would be desirable to provide an efficient, lower cost plasma source which could produce a uniform high-density plasma at low pressures over materials having large surface areas, and, in particular, semiconductor substrates having large surface areas.

SUMMARY OF THE INVENTION

Accordingly, it is one object of the present invention to provide in a materials processing device, an improved uniformity of high density plasma over a material having a large area, such as a semiconductor wafer.

It is another object of the present invention to provide in a materials processing device, an improved plasma process uniformity at the surface of a material such as a semiconductor wafer.

It is still another object of the invention to provide in a materials processing device, a unique induction coil which will provide an improved plasma process uniformity at the surface of a semiconductor wafer.

It is yet another object of the present invention to provide a unique induction coil which will minimize capacitive coupling between plasma and such induction coil in a materials processing device in order to reduce the amount of damaged devices which may occur during processing of semiconductor wafers or other materials.

It is still another object of the present invention to provide in a materials processing device, a unique induction coil which will minimize capacitive coupling between plasma and such induction coil, and thus reduce the cost and complexity of such materials processing device.

It is a further object of the present invention to provide in a materials processing device, a unique induction coil and an impedance matching circuit connected thereto to eliminate a net voltage drop which occurs in the plane of prior art induction coils in such materials processing device, and therefore improve the plasma process uniformity at the surface of a material to be processed such as a semiconductor wafer.

Therefore, in accordance with one aspect of the present invention, there is provided a plasma source for creating a plasma inside a processing chamber, such plasma for treating at least a surface of an article disposed in the processing chamber. The plasma source includes a dielectric plate, a first surface of which forms part of an inner wall of the processing chamber, and further includes an electrical energy source disposed outside the processing chamber to provide energy through the dielectric plate into the processing chamber. In a preferred embodiment, the electrical energy source includes a radiofrequency power source and a substantially planar induction coil, the latter of which has at least two spiral portions which are symmetrical about at least one point of the substantially planar induction coil. The substantially planar induction coil is disposed on a second surface of the dielectric plate for creating a high density plasma proximate the surface of the article to bombard the surface and produce a substantially uniform process rate across the article surface.

In accordance with another aspect of the present invention, the plasma source including the substantially planar induction coil is used in an apparatus for processing at least a surface of an article with plasma formed from a process gas. Such apparatus may be a sputter etching apparatus, and includes a processing chamber which defines a processing space and which has at least one inlet port through which the process gas may be input into the processing space for processing the article with the plasma. The plasma source of the present invention is coupled to an end of the processing chamber to seal the processing chamber and induces the formation of the plasma proximate the surface of the article to bombard the surface and produce a substantially uniform process rate across the article surface.

In accordance with yet another aspect of the present invention, an impedance matching circuit is connected between the plasma source of the present invention and the radiofrequency source to provide maximum power transfer between the induction coil and the radiofrequency source. In a preferred embodiment, the induction coil of the present invention has first and second leads connected to the impedance matching circuit, and is further connected through the impedance matching circuit to ground at a point about which the two portions of the induction coil are symmetrical. This reduces the net voltage drop across the plane of previous planar induction coils, and thereby improves the uniformity of the plasma, as well as the plasma process.

The features of the present invention believed to be novel are set forth with particularity in the appended claims. However, the invention itself may be best understood with reference to the following description in conjunction with the accompanying drawings.

DETAILED DESCRIPTION OF THE INVENTION

Figure 3:
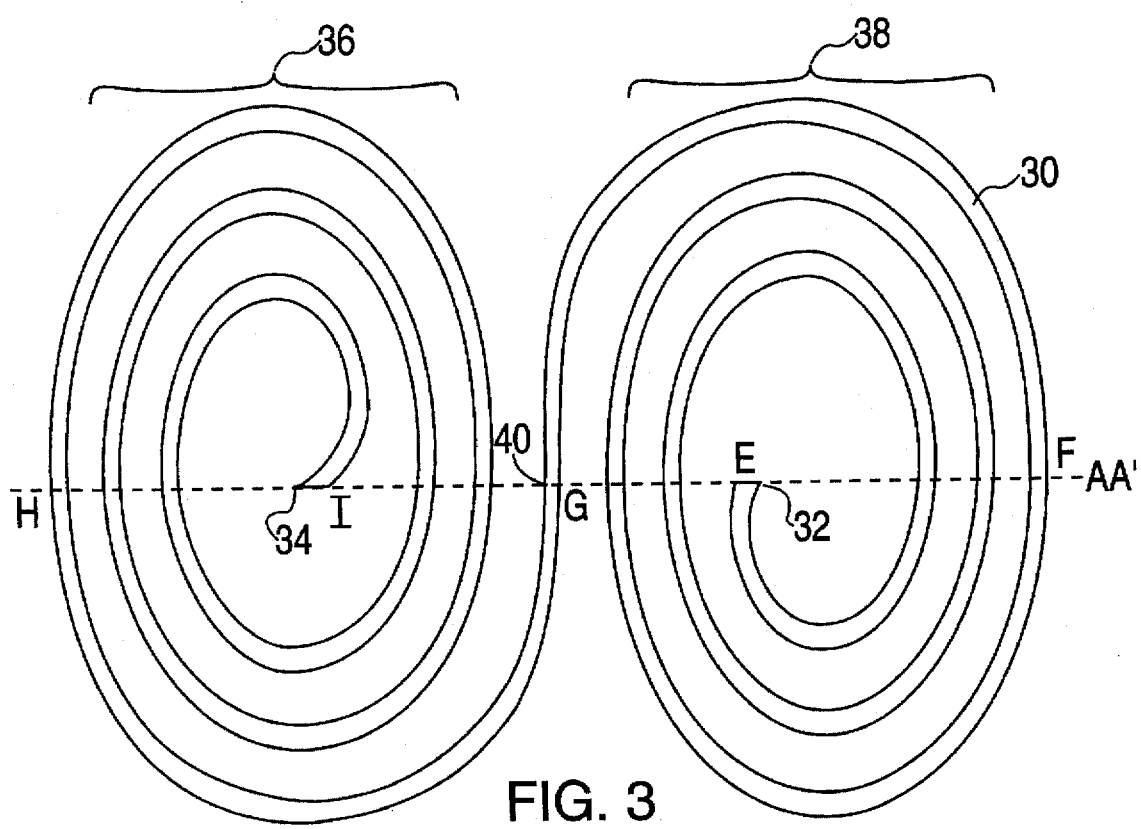
FIG. 3 shows one embodiment of the inductively-coupled plasma source (ICP) induction coil of the present invention.

As will be seen with reference to FIG. 3, the induction coil 30 of the present invention is a coil having a first lead 32 and a second lead 34. More particularly, the induction coil 30 may be thought of as a continuous "S-shaped" coil having first and second portions 36, 38, each portion of which is wound in a spiral or involute form. Preferably, the portions 36, 38, are also substantially identical and are symmetrical about at least a center point 40 of the induction coil 30. (While in FIG. 3, it will be seen that each of the portions 36, 38 has three turns; it will be appreciated that the number of turns in the induction coil 30 may be modified within parameters of the foregoing description). The induction coil 30 is preferably made of hollow copper tubing through which water is passed, the latter cooling the induction coil 30 at the same time as the radiofrequency power is being transferred therethrough.

Figure 4A:
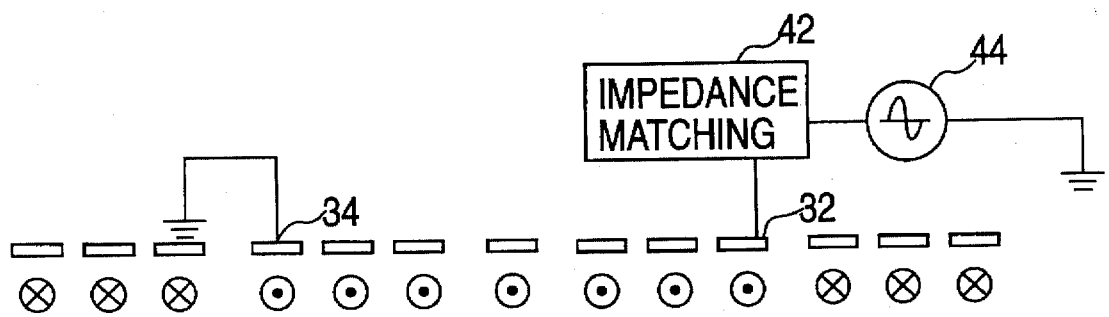
FIG. 4a shows a cross-sectional schematic view of the induction coil of FIG. 3 along the line AA', such view also showing a schematic representation of the connection of an RF power source to the induction coil through an impedance matching circuit according to one embodiment of the present invention.
Figure 4B:
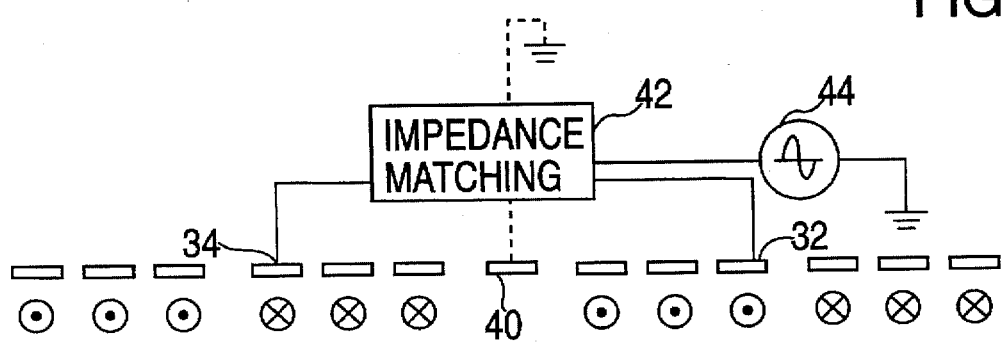
FIG. 4b shows a cross-sectional schematic view of the induction coil of FIG. 3 along the line AA', such view also showing a schematic representation of the connection of an RF power source to the induction coil according to another embodiment of the present invention.

The induction coil 30 of FIG. 3 may be connected to an RF energy source 44 for receiving energy therefrom as seen in FIGS. 4a and 4b. In the embodiment shown in FIG. 4a, lead 34 is connected to ground, while lead 32 is connected to the RF source 44 through an impedance matching circuit 42, the latter of which is designed to allow for maximum power transfer between the RF source 44 and the induction coil 30. The impedance matching circuit 42 may be either the conventional L- or Π-type circuit, with the L-type being preferred in light of its higher circuit Q-factor, better suppression of harmonics, and thus, more efficient transfer of power from the induction coil 30 to the plasma. In the embodiment shown in FIG. 4a, therefore, the resulting current will flow through the induction coil 30 from lead 32 to lead 34 along the path EFGHI.

Although the induction coil of FIG. 3 may be connected to an RF source 44 as seen in FIG. 4a, it is preferably connected to such source as shown in FIG. 4b. In such embodiment, lead 32 is connected to a first terminal of an impedance matching circuit 42, while lead 34 is connected to a second terminal of the impedance matching circuit 42. Again, the impedance matching circuit, may be either an L- or Π-type circuit, with the L-type being preferred. If an asymmetric feed is desired, then the last stage of the impedance matching circuit 42 may be a transformer with center grounding; i.e., point 40 of induction coil 30 being connected to ground (shown in dashed lines in FIG. 5). (Alternatively, the transformer can have a center tap which is connected to the RF source 44, with the leads 32, 34 being connected to ground.) As a result of this circuit configuration, a first current will flow through the induction coil 30 from lead 32 towards the impedance matching circuit 42 along the path EFG. Additionally, a second current will flow from lead 34 towards the impedance matching circuit 42 along the path IHG (FIG. 4b).

It will be appreciated that since the currents run in opposite directions through each of the two oppositely wound portions 36, 38, of proposed induction coil 30 (FIG. 4b), the electric fields generated thereby tend to cancel each other out, minimizing capacitive coupling between the coil and the plasma. Therefore, due to the minimized capacitive coupling, the plasma sheath voltage drop is reduced, thus decreasing the amount of damaged devices which may occur during processing. Furthermore, the minimized capacitive coupling eliminates the need for a Faraday shield, such as used in conjunction with the prior art induction coil 20 of FIG. 1. Elimination of the Faraday shield reduces the cost and complexity of an induction coil and attendant circuitry. Furthermore, in light of the substantially planar design of the induction coil 30 of the present invention, such induction coil 30 may be easily scaled for large area processing, such as for the processing of a 300 mm wafer applications in the microelectronics industry.

Figure 1:
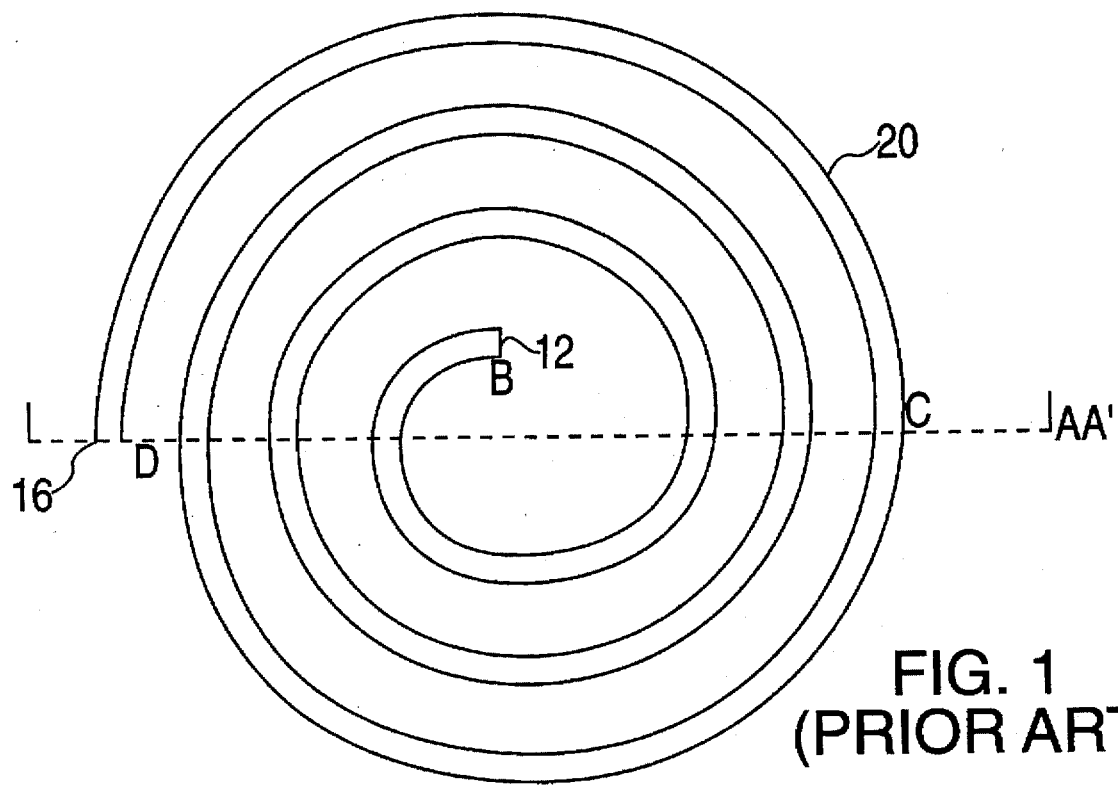
FIG. 1 shows a prior art inductively-coupled plasma source (ICP) induction coil.
Figure 2:
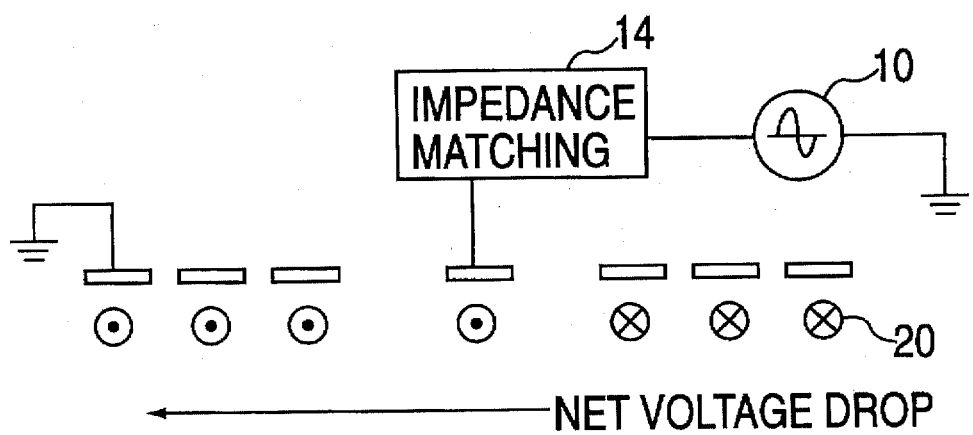
FIG. 2 shows a cross-sectional schematic view of the induction coil of FIG. 1 a along the line AA', such view also showing in broken line, a prior art manner of connecting an RF power source to the coil for creating a varying magnetic field, the direction of current through the coil, and the direction of the net voltage drop due to the manner in which the RF power source is connected to the coil.

Additionally, because of the symmetric feed of the current to the coil 30 through the matching network 42 of FIG. 4b, the net voltage drop which would ordinarily occur across the plane of the prior art induction coil 20 of FIG. 1, is eliminated. This results in non-capacitive plasma, and thus a lower plasma sheath voltage. As discussed previously a lower plasma sheath voltage will in turn decrease the amount of energy with which the ions impinge upon the substrate, thus improving the number of damaged devices which occurs during processing.

Figure 5:
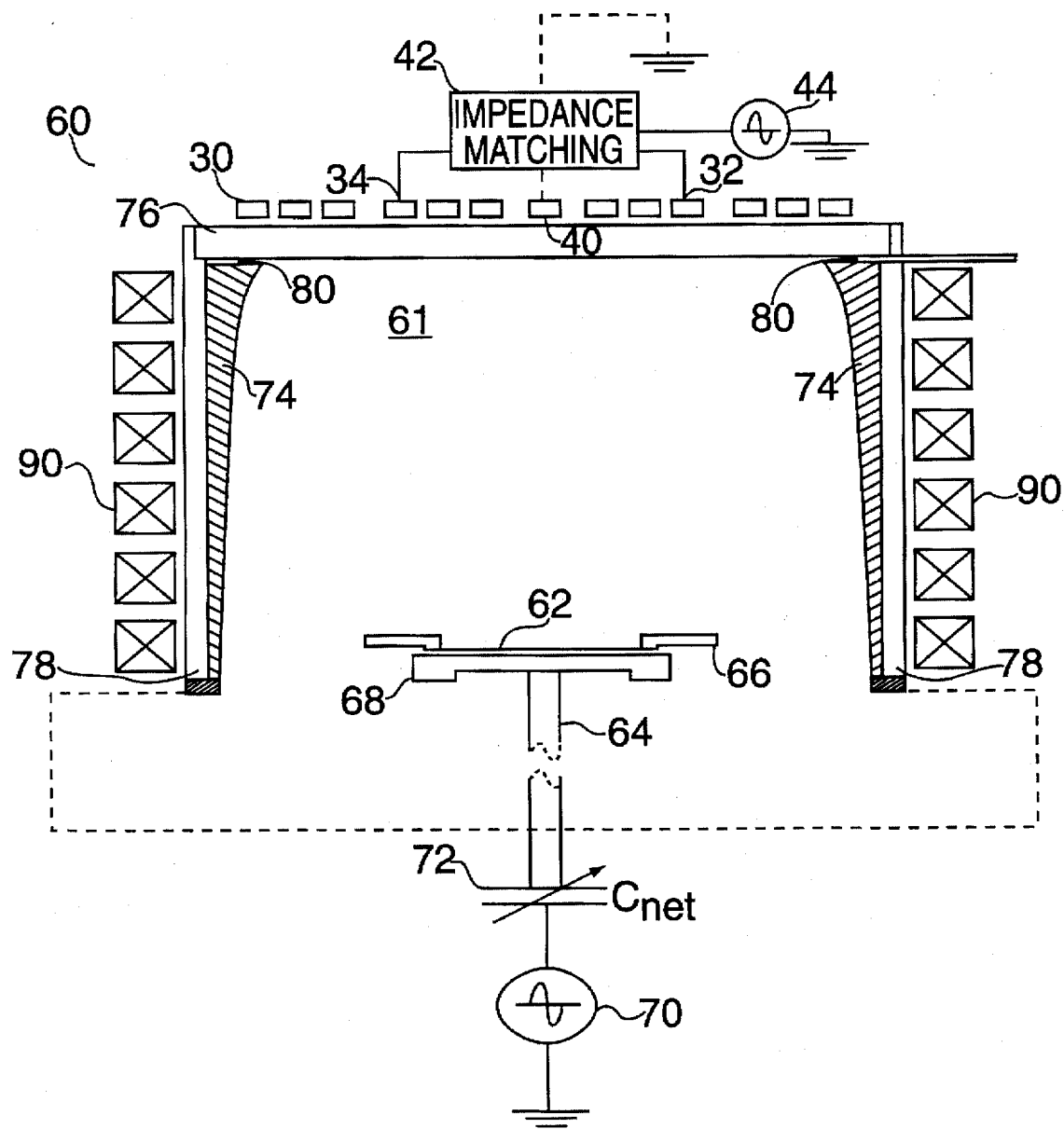
FIG. 5 shows a schematic of a sputter etching apparatus using the ICP induction coil of FIG. 3.

Application of the induction coil 30 of the present invention will be explained with reference to its use in the sputter etching apparatus of FIG. 5. It will be understood that while the explanation of the application of the induction coil 30 is given with respect to a sputter etching apparatus device 60, use of the induction coil 30 is not so limited, and may be used in other materials processing applications as known in the art, such as ion implantation and plasma deposition.

It is known that the process of sputter etching utilizes ionized particles of charged gaseous plasma to bombard a surface of a substrate or wafer, and thus dislodge, or "sputter" away particles from the substrate. More specifically, during the sputter etching process, a substrate or wafer 62 is placed on a support base 64 at one end of the sputter etching chamber 61 of the device 62, and preferably held in place through the use of an electrostatic chuck or wafer clamp 66. A bias voltage is then applied across a wafer stage 68 resting on the support base 64 through the application of radiofrequency power from a source 70 at a frequency of, for example, 13.56 MHZ. An isolating capacitor 72 is connected between the radiofrequency source 70 and the wafer stage 68 to block the DC components of the radiofrequency signal from radiofrequency source 70. A cylindrical quartz sleeve 74 is inserted into inner diameter of the sputter etching chamber 61 to protect the chamber walls from the material which is being dislodged from the wafer 62. This quartz sleeve 74 can be cleaned or replaced at regular maintenance intervals.

A plasma source including a dielectric plate 76 and the induction coil 30 of the present invention (FIG. 3) are disposed at the other, or top, end of the sputter etching chamber 61. The dielectric plate 76, which is preferably disposed a distance of 7–20 centimeters from the wafer stage 68, is coupled to the metallic chamber wall 78 of the sputter etching chamber 61 to provide a tight vacuum seal. As seen from FIG. 5, the induction coil 30 rests directly on the dielectric plate 76, both of which are preferably substantially planar. However, the dielectric plate 76 may have a generally convex inner surface extending into the sputter etching chamber 61 and a generally concave outer surface, the contour of which the induction coil 30 will follow, as set forth in more detail in U.S. patent application No. 08/410, 362, Ghanbari, "Sputter Etching Apparatus with Plasma Source Having a Dielectric Pocket and Contoured Plasma Source", which is assigned to the assignee of the present invention.

In operation, the sputter etching chamber 61 is pumped down to a base vacuum level of, for example, $1\times10^{-7}$ Torr, by a vacuum pump such as a turbo molecular or cryogenic pump (not shown), and a plasma gas, preferably argon for sputter etching applications, is introduced through gas feed inlet ports 80 near the top of the sputter etching chamber 61, typically at a flow rate of 10–100 sccm, and creating an operating pressure typically on the order of $1\times10^{-3}$–$40\times10^{-3}$ Torr. This operating pressure is controlled by a gate valve mechanism (not shown), which controls the residence time of the feedgas in the sputter etching chamber 61.

Once a stable operating pressure is achieved, power from a radiofrequency source 44 applied to the induction coil 30 through a matching circuit 42 (which is preferably the matching circuit 42 of FIG. 4b, but may be that matching circuit set forth in FIG. 4a). The radiofrequency source 44 preferably supplies such power at an operating frequency of 2–13.56 MHZ. As discussed above, the radiofrequency energy through the induction coil 30 creates a time-varying magnetic field proximate the coil 30, and this, in turn, induces an electric field, E, in the sputter etching chamber 61 according to the equation $\nabla \times E = -\partial B/\partial t$. This induced electric field, E, accelerates a small number of electrons which reside in the sputter etching chamber 61 as a result of the ionization of neutral gas by cosmic rays and other electromagnetic sources present in the environment. The accelerated electrons may collide with neutral molecules of gas and create ions and more electrons. This process continues and creates and avalanche of electrons and ions; thus creating a plasma in the sputter etching chamber 61 in the area of the induction coil 30 below the dielectric plate 76. The plasma thereafter diffuses and fills the sputter etching chamber 61.

As the plasma diffuses towards the wafer stage 68, gaseous ions in the plasma (e.g., argon ions) and near the wafer stage 68 will be accelerated theretowards because of the bias developed on the stage 68 by another RF source 70 capacitively-coupled to thereto. The accelerated argon ions hit the wafer and dislodge or "sputter" material off the wafer 62. The etched byproducts are pumped out of the sputter etching chamber 61 by the vacuum pump (not shown).

Figure 6A:
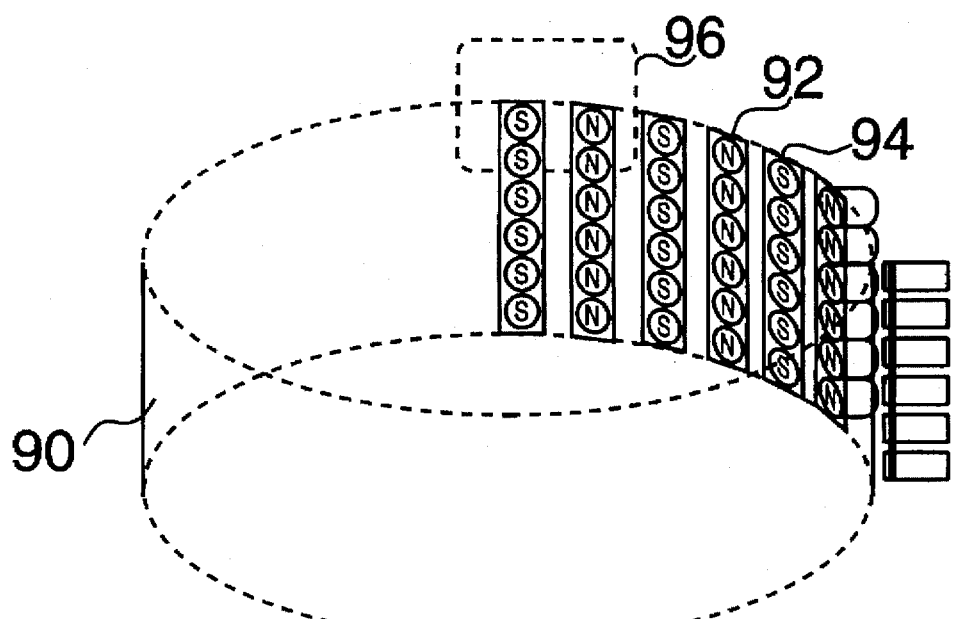
FIG. 6a shows a schematic representation of a magnetic multipole structure disposed around the sputter apparatus of FIG. 5 and used to further improve plasma uniformity.
Figure 6B:
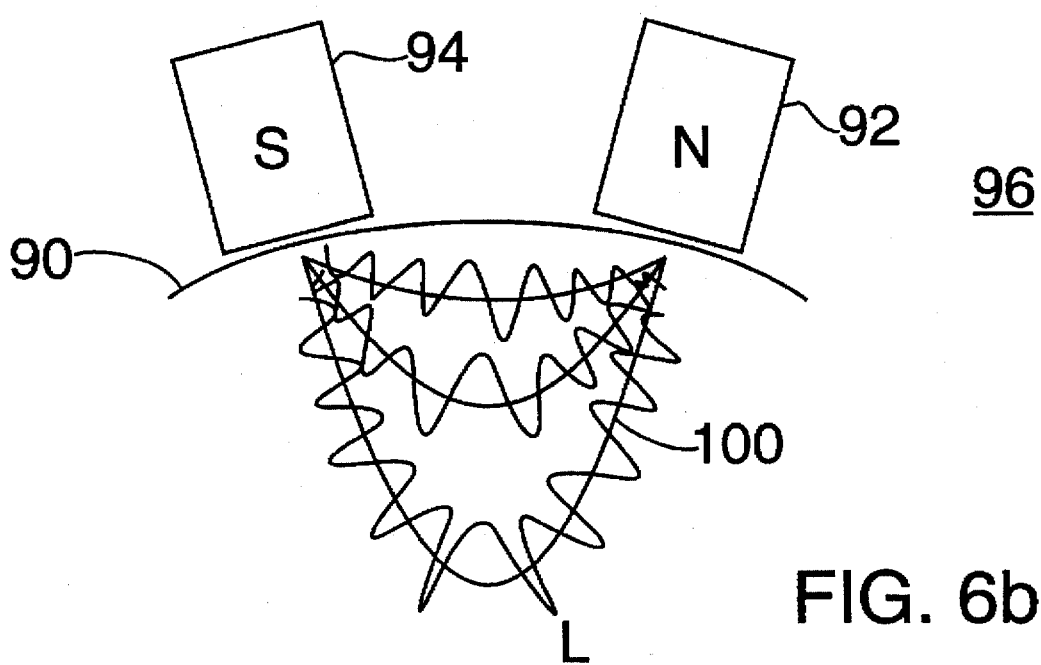
FIG. 6b is a top planar view of a magnified portion 96 of the magnetic multipolar of FIG. 6a showing a schematic representation of the plasma electrons' paths along the magnetic field lines of the multipole structure.

The sputter-etching apparatus 60 may have a magnetic multipolar structure 90 disposed around it as set forth in the dashed lines in FIG. 6a in order to increase plasma uniformity. As seen in FIG. 6a, the magnetic multipolar structure 90 surrounds the sputter-etching apparatus 60, and preferably has vertically aligned elongated regions 92, 94, such aligned regions being of alternating polarities. A magnified view of portion 96 as seen from the top of the sputter-etching apparatus 60 looking down towards the wafer stage 68 is shown in FIG. 6b. The resulting magnetic field, or magnetic cusp, formed by this magnetic multipolar structure 90 confines the electron paths 102 to the field lines 100 as shown in FIG. 6b, operating under the same concepts and principles of the well-known "magnetic mirror". As a result, the residence time of the electrons in the chamber 61 is increased and their loss rate to the surrounding inner chamber quartz sleeve 74 reduced. A reduction in the electron loss rate results in an increase in the plasma density near the boundaries of the induction coil 30, where the plasma density tends to be thinnest. By increasing the plasma density at the boundaries of the induction coil 30, the plasma uniformity, and this process uniformity, is improved.

It is therefore apparent that in accordance with the present invention, an embodiment that fully satisfies the objectives, aims and advantages is set forth above. While the invention has been described in conjunction with specific embodiments, it is evident that many alternatives, modifications, permutations and variations will become apparent to those skilled in the art in light of the foregoing description. For example, while the explanation of the application of the induction coil of the present invention is given with respect to a sputter etching apparatus device, use of the induction coil of the present invention is not so limited, and may be used in other materials processing applications as known in the art, such as ion implantation and plasma deposition. Furthermore, while the induction coil of the present invention and the dielectric plate on which it rests are preferably substantially planar, the dielectric plate may have a generally convex inner surface extending into the sputter etching chamber and a generally concave outer surface, the contour of which the induction coil of the present invention will follow. Other embodiments will occur to those skilled in the art. Accordingly, it is intended that the present invention embrace all such alternatives, modifications and variations as fall within the scope of the appended claims.

What is claimed is:

1. An apparatus for processing at least a surface of an article with plasma formed from a process gas, comprising:
    a processing chamber defining a processing space and having at least one inlet port through which said process gas may be input into said processing space for processing said article with said plasma; and,
    a plasma source coupled to an end of said processing chamber to seal said processing chamber and for inducing the formation of said plasma, said plasma source comprising:
        a dielectric plate having a first surface forming part of an inner wall of said processing chamber;
        an electrical energy source disposed outside said processing chamber, said electrical energy source for providing energy through said dielectric plate into said processing space to interact with said process gas to form said plasma, wherein said electrical energy source includes an induction coil having at least two spiral portions which are symmetrical about at least one point of said induction coil, and wherein said induction coil is disposed on a second surface of said dielectric plate for creating said plasma proximate said surface of said article to bombard said surface and produce a substantially uniform process rate across said article surface.

2. The processing apparatus of claim 1, wherein the electrical energy source includes a first radio frequency source.

3. The processing apparatus of claim 2, wherein said first radio frequency source operates in a frequency range of 2 to 13.56 MHZ.

4. The processing apparatus of claim 2, further comprising a circuit connected to said induction coil for matching the impedance of said induction coil and said first radio frequency source.

5. The processing apparatus of claim 4, wherein said impedance matching circuit comprises an L-type circuit.

6. The processing apparatus of claim 4, wherein said induction coil has a first and second lead, and wherein said impedance matching circuit has a first terminal connected to said first radio frequency source and a second terminal connected to said first lead of said induction coil, whereby a current is caused to flow from said first lead of said coil to said second lead of said coil.

7. The processing apparatus of claim 6, wherein said second lead of said induction coil is connected to ground.

8. The processing apparatus of claim 4, wherein said induction coil has a first and second lead, and wherein said impedance matching circuit has a first terminal connected to said first radio frequency source, a second terminal connected to said first lead of said induction coil, and a third terminal connected to said second lead of said induction coil.

9. The processing apparatus of claim 8, wherein said induction coil is connected through said impedance matching circuit to ground at said point about which said at least two spiral portions of said induction coil are symmetrical, whereby a first current flows from said first lead of said induction coil towards said impedance matching circuit and a second current flows from said second lead of said induction coil towards said impedance matching circuit.

10. The processing apparatus of claim 8, wherein said impedance matching circuit includes a transformer.

11. The processing apparatus of claim 10, wherein said transformer has a center tap connected to ground.

12. The processing apparatus of claim 4, further comprising:
    a support disposed within said processing chamber for supporting said article; and,
    a second radio frequency source for biasing said article with radio frequency energy.

13. The processing apparatus of claim 12, further comprising an isolating capacitor, wherein said second radio frequency source biases said article through said isolating capacitor.

14. The processing apparatus of claim 12, wherein said second radio frequency source operates at a frequency of 13.56 MHZ.

15. An apparatus for processing at least a surface of an article with plasma formed from a process gas, comprising:
    a processing chamber defining a processing space and having at least one inlet port through which said process gas may be input into said processing space for processing said article with said plasma; and,
    a plasma source coupled to an end of said processing chamber to seal said processing chamber and for inducing the formation of said plasma, said plasma source comprising:
        a dielectric plate having a first surface forming part of an inner wall of said processing chamber;

a substantially planar induction coil having two spiral portions which are symmetrical about at least one point of said substantially planar induction coil, wherein said substantially planar induction coil is disposed on a second surface of said dielectric plate outside said processing chamber, said induction coil for coupling energy through said dielectric plate into said processing space to form said plasma proximate said article surface to produce a substantially uniform process rate across said article surface.

16. The processing apparatus of claim 15, further comprising a radio frequency source for providing energy to said substantially planar induction coil.

17. The processing apparatus of claim 16, further comprising a circuit connected to said substantially planar induction coil for matching the impedance of said substantially planar induction coil and said radio frequency source.

18. The processing apparatus of claim 17, wherein said substantially planar induction coil has a first and second lead, and wherein said impedance matching circuit has a first terminal connected to said radio frequency source and a second terminal connected to said first lead of said substantially planar induction coil, whereby a current is caused to flow from said first lead of said coil to said second lead of said coil.

19. The processing apparatus of claim 18, wherein said second lead of said substantially planar induction coil is connected to ground.

20. The processing apparatus of claim 17, wherein said substantially planar induction coil has a first and second lead, and wherein said impedance matching circuit has a first terminal connected to said first radio frequency source, a second terminal connected to said first lead of said substantially planar induction coil, and a third terminal connected to said second lead of said substantially planar induction coil.

21. The processing apparatus of claim 20, wherein said substantially planar induction coil is connected through said impedance matching circuit to ground at said point about which said at least two spiral portions of said substantially planar induction coil are symmetrical, whereby a first current flows from said first lead of said substantially planar induction coil towards said impedance matching circuit and a second current flows from said second lead of said substantially planar induction coil towards said impedance matching circuit.

22. The processing apparatus of claim 17, wherein said impedance matching circuit includes a transformer.

23. A plasma source for creating a plasma inside a processing chamber, said plasma for treating at least a surface of an article disposed in said processing chamber, said plasma source comprising:

a dielectric plate having a first surface forming part of an inner wall of said processing chamber;

an electrical energy source disposed outside said processing chamber, said electrical energy source for providing energy through said dielectric plate into said processing space to interact with said process gas to form said plasma, wherein said electrical energy source includes an induction coil having at least two spiral portions which are symmetrical about at least one point of said induction coil, and wherein said induction coil is disposed on a second surface of said dielectric plate for creating a high density plasma proximate said surface of said article to bombard said surface and produce a substantially uniform process rate across said article surface.

24. The plasma source of claim 23, wherein the electrical energy source includes a first radio frequency source.

25. The plasma source of claim 24, further comprising a circuit connected to said induction coil for matching the impedance of said induction coil and said first radio frequency source.

26. The plasma source of claim 25, wherein said induction coil has a first and second lead, and wherein said impedance matching circuit has a first terminal connected to said first radio frequency source and a second terminal connected to said first lead of said induction coil.

27. The plasma source of claim 26, wherein said second lead of said induction coil is connected to ground.

28. The plasma source of claim 25, wherein said induction coil has a first and second lead, and wherein said impedance matching circuit has a first terminal connected to said first radio frequency source, a second terminal connected to said first lead of said induction coil, and a third terminal connected to said second lead of said induction coil.

29. The processing apparatus of claim 28, wherein said induction coil is connected through said impedance matching circuit to ground at said point about which said at least two spiral portions of said induction coil are symmetrical, whereby a first current flows from said first lead of said induction coil towards said impedance matching circuit and a second current flows from said second lead of said induction coil towards said impedance matching circuit.

30. The plasma source of claim 25, wherein said impedance matching circuit includes a transformer.

31. The plasma source of claim 30, wherein said transformer has a center tap connected to ground.

32. A plasma source for creating a plasma inside a processing chamber, said plasma for treating at least a surface of an article disposed in said processing chamber, said plasma source comprising:

a dielectric plate having a first surface forming part of an inner wall of said processing chamber;

a substantially planar induction coil, a first portion of which comprises a first spiral, and a second portion of which comprises a second spiral substantially identical to said first spiral, wherein said substantially planar induction coil forms an "S-shape" pattern, and wherein said substantially planar induction coil is disposed on a second surface of said dielectric plate outside said processing chamber, said induction coil for coupling energy through said dielectric plate into said processing space to form said plasma proximate said article surface to produce a substantially uniform process rate across said article surface.

33. A method of processing at least a surface of an article with plasma, comprising the steps of:

disposing said article in a processing chamber having at least one inlet port through which a process gas may be input;

introducing said process gas into said processing chamber at a controlled operating pressure;

coupling a plasma source to an end of said processing chamber to seal said processing chamber and to induce the formation of said plasma, said plasma source comprising:

a dielectric plate having a first surface forming part of an inner wall of said processing chamber;

a substantially planar induction coil having at least two spiral portions which are symmetrical about at least one point of said substantially planar induction coil, wherein said substantially planar induction coil is disposed on a second surface of said dielectric plate outside said processing chamber, and wherein said induction coil couples energy through said dielectric plate into said processing space to form said plasma proximate said article surface to produce a substantially uniform process rate across said article surface.

34. The method of claim 33, further comprising the step of connecting an energy source to said substantially planar induction coil for providing energy thereto.

35. The method of claim 34, wherein said energy source is a radiofrequency energy source.

36. The method of claim 35, wherein said radiofrequency energy source operates in a frequency range of 2 to 13.56 MHZ.

37. The method of claim 34, further comprising the step of:

connecting a first terminal of an impedance matching circuit to said energy source; and, connecting a second terminal of said impedance matching circuit to a first lead of said substantially planar induction coil, whereby a current is caused to flow from said first lead of said coil to said second lead of said coil.

38. The method of claim 37, further comprising the step of connecting a second lead of said substantially planar induction coil to ground.

39. The method of claim 34, further comprising the steps of:

connecting a first terminal of an impedance matching circuit to said energy source;

connecting a second terminal of said impedance matching circuit to a first lead of said substantially planar induction coil; and, connecting a third terminal of said impedance matching circuit to said second lead of said substantially planar induction coil.

40. The method of claim 39, further comprising the step of connecting said substantially planar induction coil through said impedance matching circuit to ground at said point about which said at least two spiral portions of said substantially planar induction coil are symmetrical, whereby a first current flows from said first lead of said substantially planar induction coil towards said impedance matching circuit and a second current flows from said second lead of said substantially planar induction coil towards said impedance matching circuit.

41. An apparatus for processing at least a surface of an article with plasma formed from a process gas, comprising:

a processing chamber defining a processing space and having at least one inlet port through which said process gas may be input into said processing space for processing said article with said plasma; and, a plasma source coupled to an end of said processing chamber to seal said processing chamber and for inducing the formation of said plasma, said plasma source comprising:

a dielectric plate having a first surface forming part of an inner wall of said processing chamber;

a substantially planar induction coil, a first portion of which comprises a first spiral, and a second portion of which comprises a second spiral, wherein said first and second spiral portions are substantially identical and form a continuous "S-shape", and wherein said substantially planar induction coil is disposed on a second surface of said dielectric plate outside said processing chamber, said induction coil for coupling energy through said dielectric plate into said processing space to form said plasma proximate said article surface to produce a substantially uniform process rate across said article surface.

* * * * *